United States Patent
Abe et al.

(10) Patent No.: US 11,603,469 B2
(45) Date of Patent: Mar. 14, 2023

(54) THERMALLY CURABLE RESIN COMPOSITION AND FILM OBTAINED THEREFROM

(71) Applicant: PANASONIC INTELLECTUAL PROPERTY MANAGEMENT CO., LTD., Osaka (JP)

(72) Inventors: Takatoshi Abe, Osaka (JP); Tomoaki Sawada, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 115 days.

(21) Appl. No.: 16/625,316

(22) PCT Filed: Jun. 29, 2018

(86) PCT No.: PCT/JP2018/024817
§ 371 (c)(1),
(2) Date: Dec. 20, 2019

(87) PCT Pub. No.: WO2019/009201
PCT Pub. Date: Jan. 10, 2019

(65) Prior Publication Data
US 2021/0301137 A1    Sep. 30, 2021

(30) Foreign Application Priority Data

Jul. 5, 2017  (JP) .............................. JP2017-132064

(51) Int. Cl.
*C08L 87/00* (2006.01)
*H05K 1/03* (2006.01)

(52) U.S. Cl.
CPC ......... *C08L 87/005* (2013.01); *C08L 2203/30* (2013.01); *C08L 2205/03* (2013.01); *H05K 1/0346* (2013.01)

(58) Field of Classification Search
CPC ................................................ C08L 63/00–10
See application file for complete search history.

(56) References Cited

U.S. PATENT DOCUMENTS

| | | | |
|---|---|---|---|
| 2008/0097039 A1 | 4/2008 | Ito et al. | |
| 2015/0373838 A1 | 12/2015 | Sawada et al. | |
| 2016/0122605 A1 | 5/2016 | Hayashi | |
| 2016/0136484 A1* | 5/2016 | Inoue | A63B 37/0031 473/377 |
| 2016/0152016 A1 | 6/2016 | Abe et al. | |
| 2016/0264813 A1* | 9/2016 | Sawada | H05K 1/0213 |
| 2016/0266668 A1 | 9/2016 | Sawada et al. | |
| 2016/0304690 A1 | 10/2016 | Takemoto et al. | |
| 2016/0340485 A1 | 11/2016 | Nomura et al. | |
| 2018/0263113 A1 | 9/2018 | Sawada et al. | |

FOREIGN PATENT DOCUMENTS

| | | |
|---|---|---|
| JP | 2016-102669 | 6/2016 |
| JP | 2016-534164 | 11/2016 |
| JP | 2016-204434 A | 12/2016 |
| WO | WO 2005/095493 A1 | 10/2005 |
| WO | WO 2014/196636 A1 | 12/2014 |
| WO | WO 2015/129513 A1 | 9/2015 |

OTHER PUBLICATIONS

ISR for PCT/JP2018/024817, dated Oct. 2, 2018.

* cited by examiner

*Primary Examiner* — Ana L. Woodward
(74) *Attorney, Agent, or Firm* — Greenblum & Bernstein, P.L.C.

(57) ABSTRACT

The present invention relates, in one aspect, to a thermosetting resin composition including an epoxy resin, an isocyanate resin, a polyrotaxane resin, and a curing agent, wherein the isocyanate resin includes a hexamethylene skeleton and at least one selected from a biuret skeleton, an isocyanurate skeleton, an allophanate skeleton, a neopentyl skeleton, a butylene skeleton, and a dicarboxyl skeleton in a structure thereof.

7 Claims, No Drawings

THERMALLY CURABLE RESIN COMPOSITION AND FILM OBTAINED THEREFROM

TECHNICAL FIELD

The present invention relates to a thermosetting resin composition being low in stress relaxation ratio and superior in recoverability, heat resistance and stretchability, and a film obtained therefrom.

BACKGROUND ART

Thermosetting resin is used in a wide variety of fields such as electronic material applications and optical materials due to its superior heat resistance, chemical resistance, moldability, insulation reliability, and so on. In particular, as a thermosetting resin, an epoxy resin is often used for various applications, but an epoxy resin is superior in the above-mentioned characteristics, whereas it is generally known to be hard and poor in softness. Therefore, it may be deformed or broken by external stress or thermal stress.

In recent years, stretchable film materials have been considered as environment-friendly materials for electronics such as printed electronics, wearable electronics, and IoT (Internet of Things). As such a stretchable film material, silicone resin, fluororesin, urethane resin, etc. have been widely considered. However, silicone resin and fluororesin are poor in tight adhesion property, and urethane resin has low heat resistance, so there is a concern about heat resistance for adapting it to processes typified by solder mounting.

In order to deal with these problems, there has been proposed a method of combining heat resistance and stretchability like that of rubber by blending rotaxane with a polymer or resin and thereby imparting a stress relaxation property (Patent Literature 1 to 3).

However, in the prior technique as described above, it is also known that the stretchability is improved, but stress is relaxed, and thus the recoverability after extension depends on temperature and time.

Furthermore, in the technique described in Patent Literature 1, it is reported that elongation and heat resistance can be improved by providing a composition including a polyrotaxane and a compound containing two or more oxirane groups and/or oxetane groups, but further improvement is required for elastic modulus, heat resistance and durability.

Further, the technique described in Patent Literature 2 is a polyol composition including a polyol component, an isocyanate component and a polyrotaxane and being capable of suppressing wobbling feeling, which has low elasticity (low tensile modulus), but does not have sufficient elongation.

Patent Literature 3 reports that elongation is improved by a material including a polyrotaxane and a polymer that at least partially bonds to the polyrotaxane. However, there is a concern that its heat resistance and recoverability are not sufficient.

The present invention has been made in view of such circumstances, and an object thereof is to provide a thermosetting resin composition being low in stress relaxation ratio and being superior in recoverability, heat resistance and stretchability, and a film obtained therefrom.

CITATION LIST

Patent Literature

Patent Literature 1: WO 2014/196636 A1
Patent Literature 2: JP-A-2016-204434
Patent Literature 3: WO 2005/095493 A1

SUMMARY OF INVENTION

As a result of intensive studies, the present inventors found that the above-mentioned problems can be solved by a resin composition having the following configuration, and have completed the present invention through further investigation based on such findings.

That is, the thermosetting resin composition according to one aspect of the present invention includes an epoxy resin, an isocyanate resin, a polyrotaxane resin, and a curing agent, wherein the isocyanate resin includes a hexamethylene skeleton and at least one selected from a biuret skeleton, an isocyanurate skeleton, an allophanate skeleton, a neopentyl skeleton, a butylene skeleton, and a dicarboxyl skeleton in a structure thereof.

DESCRIPTION OF EMBODIMENTS

Hereinafter, embodiments according to the present invention will be specifically described; however, the present invention is not limited to the description.

The thermosetting resin composition according to the present embodiment includes an epoxy resin, an isocyanate resin, a polyrotaxane resin, and a curing agent, wherein the isocyanate resin includes a hexamethylene skeleton and at least one selected from a biuret skeleton, an isocyanurate skeleton, an allophanate skeleton, a neopentyl skeleton, a butylene skeleton, and a dicarboxyl skeleton in a structure thereof.

This configuration makes it possible to provide a thermosetting resin composition being low in stress relaxation ratio and superior in shape recoverability, heat resistance and stretchability, and a film obtained therefrom.

Further, since the thermosetting resin composition has the above characteristics, it can be applied to various technical fields such as an optical field, an electronic field, an adhesive field, and a medical field in addition to IoT and flexible display devices, and therefore it is very advantageous for industrial use.

In the present embodiment, "be low in stress relaxation ratio" means the performance that when a certain stress is applied to a film, a certain amount of strain is exhibited with good reproducibility and the amount of strain is hardly affected by the time for applying the stress. When the stress relaxation ratio is low like this, it is expected that the influence of the environment on the recoverability described below can be suppressed. In addition, in a movable part of a device or the like or clothes of wear for sports with vigorous movement, it may be preferable that the stress relaxation ratio of the material applied thereto be lower. In such a case, the resin composition of the present embodiment is preferably used.

In the present embodiment, the stress relaxation property of the thermosetting resin composition and the film are defined, for convenience, by a stress relaxation ratio R measured by an extension-recovery test described below. Preferably, the thermosetting resin composition of the present embodiment has a stress relaxation ratio R of about $0 \leq R \leq 30\%$ in a cured product thereof.

The "recoverability" of shape as referred to in the present embodiment means that there are little plastic deformation and little residual strain. Therefore, in the present embodiment, the shape recoverability of the thermosetting resin composition and the film are defined, for convenience, by a residual strain ratio $\alpha$ measured by an extension-recovery test described below. Preferably, a cured product of the thermosetting resin composition of the present embodiment has a residual strain ratio α of about $0 \leq \alpha \leq 3\%$.

Combining the characteristics of being low in stress relaxation property responding to tension and being superior in shape recoverability after extension is expected to make it possible to provide a material superior in followability to repeated or quick motion.

In the present embodiment, a "cured product" of a thermosetting resin composition refers to the state of a resin that has undergone a curing reaction via a process of providing the resin composition with energy such as heat or light sufficient for curing the resin composition. The cured product of the present embodiment is insoluble and infusible with superior heat resistance, that is, it does not exhibit plasticity even when heated.

Hereinafter, the components included in the thermosetting resin composition of the present embodiment will be described. Preferably, at least a part of the thermosetting resin of the present embodiment is in an uncrosslinked state. That is, it is desirable that the functional groups in the polyrotaxane resin described later are in an uncrosslinked state and at least one or preferably both of the epoxy groups in the epoxy resin described later are in an uncrosslinked state. As a more preferred embodiment, if a part of the functional groups and/or the epoxy groups of the reactive resin (curable resin) including the polyrotaxane resin and the epoxy resin are crosslinked and the remaining majority are uncrosslinked, it is expected that a semi-cured substrate, film, or the like that can be handled more easily during sticking or lamination can be obtained.

As a means for obtaining a resin composition in which the curable resin contained therein is in such an uncrosslinked state (semi-cured state), for example, it can be performed by adjusting the heat-drying conditions as described later.

(Epoxy Resin)

Examples of the epoxy resin to be used in the thermosetting resin composition of the present embodiment specifically include bisphenol A type epoxy resin, bisphenol F type epoxy resin, bisphenol S type epoxy resin, aralkyl epoxy resin, phenol novolac type epoxy resin, alkylphenol novolac type epoxy resin, biphenol type epoxy resin, naphthalene type epoxy resin, and dicyclopentadiene type epoxy resin. Moreover, for example, an epoxidized product of a condensate of a phenol and an aromatic aldehyde having a phenolic hydroxyl group, triglycidyl isocyanurate, and an alicyclic epoxy resin are included. Depending on the situation, these may be used singly or two or more of them may be used in combination.

More preferably, the epoxy resin is, for example, an epoxy resin that includes a benzene ring skeleton in its structure, has a molecular weight of 200 g/mol to 6000 g/mol, and has an epoxy equivalent of 200 eq/g to 3000 eq/g. Using such an epoxy resin offers an advantage that superior applicability is achieved because it dissolves with various materials and solvents during compounding and both maintenance of stretchability without becoming brittle and heat resistance can be attained.

As such an epoxy resin, commercially available products may be used; examples thereof include JER1003 (manufactured by Mitsubishi Chemical Corporation, having 7 to 8 methyl groups, bifunctional, molecular weight: 1300), EXA-4816 (manufactured by DIC Corporation, molecular weight: 824, having many methyl groups, bifunctional), ST-6100 (manufactured by Nippon Steel Chemical Co., Ltd., bifunctional, molecular weight: 2000), EP-4003S (manufactured by ADEKA Corporation, bifunctional, molecular weight: 1000), and YL-7175-500 (manufactured by Mitsubishi Chemical Corporation, bifunctional, molecular weight: 600), and, in addition, bisphenol A type epoxy resin, bisphenol F type epoxy resin, cresol novolac type epoxy resin, phenol novolac type epoxy resin, and multimers thereof are also included.

Epoxy resins as those described above may be used singly, or two or more types thereof may be used in combination.

In the present embodiment, the content of the epoxy resin is preferably about 15 to 50% by mass, and more preferably about 20 to 50% by mass, based on the entire resin composition. It is expected that the characteristics of heat resistance and high elasticity of a resin composition can be obtained by blending an epoxy resin in such a blending ratio. More preferably, the content is 30 to 45% by mass.

(Isocyanate Resin)

In the resin composition of the present embodiment, the isocyanate resin serves as a crosslinking agent. The isocyanate resin that can be used in the present embodiment has a hexamethylene skeleton in its structure. Furthermore, the isocyanate resin that can be used in the present embodiment includes, in addition to a hexamethylene skeleton, at least one selected from a biuret skeleton, an isocyanurate skeleton, an allophanate skeleton, a neopentyl skeleton, a butylene skeleton, and a dicarboxyl skeleton, in the structure thereof.

By including such an isocyanate resin, the resin composition of the present embodiment can be provided with characteristics of being superior in reactivity, capable of being heat-cured efficiently, and superior in low stress relaxation property.

More specific isocyanate resins include, for example, BURNOCK DN-955 and DN-992 manufactured by DIC Corporation, TAKENATE D-170N, D-165N, D-178N, D-204 and D-127N manufactured by Mitsui Chemicals, Inc., and DURANATE 24A-100, TPA-100, TUL-100, TSE-100, D101, D201 and A201H manufactured by Asahi Kasei Corp.

Isocyanate resin such as those described above may be used singly or two or more types thereof may be used in combination.

In the present embodiment, the content of the isocyanate resin is not particularly limited, and is preferably about 10 to 30% by mass based on the entire resin composition.

(Polyrotaxane Resin)

The polyrotaxane resin to be used in the present embodiment is a molecule having a structure in which a linear chain-like shaft molecule penetrates a cyclic molecule and the ends are blocked so that the cyclic molecule does not escape. Specifically, the polyrotaxane as described in Japanese Patent No. 4482633 is mentioned, for example.

By including such a polyrotaxane resin, the resin composition of the present embodiment can be provided with the characteristics of being superior in reproducibility and recoverability at the time of being deformed.

Examples of the polyrotaxane that can be used in the present embodiment include a compound in which a molecule with terminal functional groups that serves as a shaft molecule is included in a cyclic molecule in a skewered manner and the terminal functional groups are each chemically modified with a blocking group sufficiently bulky to prevent the cyclic molecule from leaving. The compound is not limited with respect to the structure and kind of its constituent molecules, the inclusion ratio of the cyclic molecule, the method for its production, etc. as long as it has the structure as described above.

The shaft molecule that can be included in the polyrotaxane is not limited as long as it has a molecular weight of 10,000 or more and can be chemically modified at its ends with blocking groups, and examples thereof include polyvinyl alcohol, polyvinyl pyrrolidone, poly(meth)acrylic acid cellulose resin, polyacrylamide, polyethylene oxide, polyethylene glycol, polypropylene glycol, polyvinyl acetal resin, polyvinyl methyl ether, polyamine, polyethyleneimine, casein, gelatin, starch, polyolefin, polyester, polyvinyl chloride, polystyrene, such copolymers as acrylonitrile-styrene copolymers, acrylic resins, polycarbonate, polyurethane, polyvinyl butyral, polyisobutylene, polytetrahydrofuran, polyamide, polyimide, polydiene, polysiloxane, polyurea, polysulfide, polyphosphazene, polyketone, polyphenylene, polyhaloolefin, and derivatives thereof. Among these, polyethylene glycol is preferably used.

In addition, the cyclic molecule that can be included in the polyrotaxane is not particularly limited as long as it is a cyclic molecule that allows polymer molecules to pass therethrough and is a cyclic molecule having at least one reactive group so that it can react with a crosslinking agent. Examples thereof specifically include cyclodextrins, crown ethers, cryptands, macrocyclic amines, calixarenes, and cyclophanes. Among these, cyclodextrins, substituted cyclodextrins, and more preferably those in which a reactive group (functional group) is further introduced into the substituted structure are used.

Preferred examples of the functional group to be introduced into the cyclic molecule of the polyrotaxane include a hydroxyl group, a carboxyl group, an acryl group, a methacryl group, an epoxy group, and a vinyl group. Preferably, the polyrotaxane of the present embodiment has at least one reactive hydroxyl group in its structure. This makes it possible to control the curability by heat curing and impart heat resistance. In addition, there is an advantage that a tough polymer network is formed and breaking strength is improved.

As the polyrotaxane resin of the present embodiment, a polyrotaxane resin having a hydroxyl group equivalent of about 300 to 1000 eq/g is particularly preferable.

The functional groups introduced into cyclic molecules in such a manner enable the cyclic molecules themselves or the polyrotaxane and the resin to crosslink via a crosslinking agent. The resin connected with the polyrotaxane in such a manner can acquire softness.

The structure (terminal blocking group) for blocking the ends in the polyrotaxane of the present embodiment is not particularly limited as long as it is a structure having a bulkiness as large as the cyclic molecule is not allowed to escape. Specifically, for example, a cyclodextrin group, an adamantane group, a dinitrophenyl group, a trityl group, an adamantane group, etc. are preferably used.

The cyclic molecule to be used has no particular limitations as long as it can include a chain-like polymer molecule in its ring. The cyclic molecule that can be preferably used may be cyclodextrin. Moreover, it is preferable that the cyclic molecule has a functional group. Furthermore, the functional group is preferably an —OH group, an acryl group, or a methacryl group.

The polyrotaxane resin that can be used in the present embodiment can be synthesized by a known method (for example, the methods described in WO 01/83566 A1, JP-A-2005-154675, Japanese Patent No. 4482633, etc.), but commercially available products may be used, and specifically, SeRM Super Polymers SH3400P and SH2400P manufactured by Advanced Softmaterials Inc. can be used.

The molecular weight of the polyrotaxane resin that can be used in the present embodiment is preferably about 300,000 to 1,200,000 g/mol.

In the present embodiment, the content of the polyrotaxane resin is not particularly limited, but it is preferably 20 to 70% by mass, and more preferably about 30 to 50% by mass, based on the entire resin composition.

(Curing Agent)

The curing agent to be used in the present embodiment is not particularly limited as long as it serves as a curing agent for a thermosetting resin. In particular, examples of a curing agent that can be preferably used for an epoxy resin include phenol resins, amine compounds, acid anhydrides, imidazole compounds, sulfide resins, and dicyandiamide. Further, a light/ultraviolet curing agent, a thermal cationic curing agent, or the like can be used. Depending on the situation, these may be used singly or two or more of them may be used in combination.

In the present embodiment, the content of the curing agent is not particularly limited as long as it serves as a curing agent, and is preferably about 0.01 to 5% by mass based on the entire resin composition.

(Other Additives)

Furthermore, the resin composition according to the present embodiment may optionally include other additives such as a curing catalyst (curing accelerator), a flame retardant, a flame retardant assistant, a leveling (surface conditioning) agent, and a colorant as long as the effects of the present invention are not impaired.

Moreover, it is preferable that the resin composition of the present embodiment further includes a filler. This has the advantage that not only resin strength and thermal expansion coefficient can be controlled, but also water absorbing property and electrical conductivity can be controlled.

Furthermore, as the filler that can be included in the resin composition of the present embodiment, various types of fillers can be chosen depending on the application, etc. The resin composition desirably includes at least one type selected from among organic fiber, carbon fiber, glass fiber, and metal fiber as a filler. By including such a filler, it is possible to reinforce the strength of resin, so that not only a supple and tough resin composition is formed, but also it is expected to become easy to control linear expansion and handle the resin composition as a film. Furthermore, there is an advantage of being superior in terms of conductivity and cost. Such fibers may optionally be subjected on the surface thereof to surface modification such as coupling treatment or graft polymerization, and the method thereof may be a conventional method or an improved method. The mode of weaving the fibers is not particularly limited, and examples thereof include non-woven fabrics and woven fabrics.

Specific examples of the organic fibers include fibers based on such materials as polyethylene, polyparaphenylene benzobisoxazole, aramid, polyester, vinylon, polypropylene, nylon, rayon, polylactic acid, polyarylate, polyphenylene sulfide, polyimide, and fluorine.

Specific examples of the metal fibers include textiles of steel or silver, and random meshes.

Further specific examples of the filler include a filler selected from among a spherical filler, a crushed filler, a flaky filler, and a discontinuous fibrous filler. The component of the filler to be blended is not particularly limited, and examples thereof include at least one type selected from among Si, Cu, Ag, Au, Al, Mg, Pt, and Ti. By including such a filler, it is expected to be possible to improve cost and such characteristics as linear expansion, conductivity, flame retardancy, and optical characteristics such as refractive index.

The size or particle diameter of the filler is not particularly limited, and if the particle diameter falls within the range of 1 nm to 100 nm, it is possible to effectively modify optical characteristics, linear expansion, conductivity, or the like with a relatively small addition amount. A particle diameter of 100 nm to 50 μm is advantageous in terms of cost, superior in handleability, and superior in manufacturing cost.

Specific examples of Si, Cu, Ag, Au, Al, Mg, Pt, and Ti include various fillers with a shape of particle, flake or wire of silica, copper particles, copper plated particles, silver particles, silver flakes, silver wires, silver plated particles, gold particles, gold wires, gold plated particles, aluminum particles, aluminum oxide particles, aluminum hydroxide particles, magnesium particles, magnesium hydroxide, magnesium oxide, platinum particles, platinum plated particles, titanium particles, titanium oxide particles, and titanium oxide coated particles. These may be blended singly or two or more types thereof may be blended. The method of using these particles may be a conventional or improved method, and specifically, a filler may be mixed in a varnish prepared by dissolving a resin in a solvent, dispersed by use of a dispersing device such as a bead mill, a jet mill, a planetary stirrer, a homodisper, or an ultrasonic wave, and then used.

Further specific examples of the filler include a filler selected from among carbon nanotubes, metal wires, and cellulose nanofibers. Including such fillers is preferable in that conductivity can be efficiently imparted thereby. In other words, for the purpose of imparting conductivity, the same conductivity can be imparted with a relatively small addition amount compared to a spherical or flaky conductive material, so that this is not only superior in cost but also preferable in terms of being easy to maintain the characteristics of resin and is preferable in terms of being capable of maintaining conductivity even in various deformations such as stretching and shrinking or folding.

The method for dispersing such a conductive material in the resin may be a conventional method or an improved method. Specifically, a filler can be dispersed in a resin by preparing in advance a dispersion liquid in which a dispersant such as cellulose, amine-based dispersant, sulfuric acid-based dispersant or ionic liquid and the filler are added in a solvent such as water, methyl isobutyl ketone, methyl ethyl ketone, toluene, acetone, dimethylformamide, further adding a resin thereto, and thereafter removing the solvent.

The type of the carbon nanotube is not particularly limited, and specific examples thereof include single-layered carbon nanotubes, double-layered carbon nanotubes, and multi-layered carbon nanotubes. The synthesis method for obtaining these carbon nanotubes may be a known method or an improved method. Depending on the purpose, for example, in order to place more importance on conductivity, for example, a carbon nanotube with high crystallinity having a G/D ratio of 10 or more in Raman spectroscopy is preferably used.

Specific examples of the metal wire include discontinuous metal fibers having a large aspect ratio, such as silver nanowires, silver nanorods, and gold nanorods.

Such carbon nanotubes and metal wires are not particularly limited in size, and a diameter of 1 nm to 100 nm and a length of 1 μm to 10 mm are preferably chosen in terms of conductivity and reinforcement due to dispersion in the resin.

The kind of the cellulose nanofiber is not particularly limited, and specific examples thereof include cellulose nanofibers, cellulose nanocrystals, cellulose nanowhiskers, bacterial nanofibers, and electrospun cellulose. The synthesis method for obtaining such cellulose nanofibers may be a known method or an improved method. Depending on the purpose, for example, in order to place more importance on toughness and linear expansion, for example, cellulose nanofibers or dispersants that have been surface modified to improve dispersibility in resins are preferably used.

Any of the fillers described above may be used singly or two or more types thereof may be used in combination.

When the resin composition of the present embodiment includes a filler, the content of the filler can be appropriately set depending on the application, etc. of the resin composition, and usually, it is preferably about 0.05% by mass to 80% by mass. The content within this range is preferable in that it is possible to provide a moderate function while maintaining the characteristics of the resin. Further, when the filling amount is 0.05% by mass to 50% by mass, this is considered more preferable in that the residual strain is small.

(Method for Preparing Resin Composition)

The method for preparing the resin composition including the polyrotaxane according to the present embodiment is not particularly limited; for example, the resin composition of the present embodiment can be obtained by first mixing an epoxy resin, an isocyanate resin, a polyrotaxane resin, a curing agent, and a solvent into a uniform state. The solvent to be used is not particularly limited; for example, toluene, xylene, methyl ethyl ketone, acetone, etc. can be used. Such solvents may be used singly or two or more types thereof may be used in combination. Moreover, an organic solvent for adjusting viscosity or additives may be blended as necessary.

The resin composition obtained as described above is cured and shaped into a film form while evaporating the solvent by heat-drying the resin composition, and thus a thermosetting resin film can be obtained.

The method, device, and conditions thereof for heat-drying the resin composition may be various means similar to those conventionally used or their improved means. The specific heating temperature and time can be appropriately set depending on the crosslinking agent and the solvent to be used; for example, the resin composition can be cured by heating and drying at 50 to 200° C. for about 60 to 120 minutes.

In addition, under the drying conditions, the volatilization rate of the solvent is sufficiently faster than the curing reaction of the resin, and a semi-cured film (or film-shaped resin composition) can be obtained by temporarily terminating the heat-drying when the drying has been performed sufficiently. The semi-cured state is a state in which an unreacted resin is included and the resin is softened or remelted by heating. It is conceivable that high adhesion strength can be obtained because the resin composition in such a semi-cured state (so-called prepreg state) can be heat-molded using a mold such as a metal mold and at that time, the semi-cured (uncrosslinked) resin forms covalent bonds with hydroxyl groups or the like located on the surface of an adherend.

In the present embodiment, the drying method, device, and conditions thereof for obtaining the semi-cured resin composition or film may be means similar to those conventionally used or their improved means. The specific drying temperature and time can be appropriately set depending on the crosslinking agent and the solvent to be used; for example, a semi-cured resin composition or film of the resin composition described above can be obtained by heating and drying at 80° C. to 130° C. for about 2 minutes to 15 minutes.

(Application)

The resin composition and the film of the present embodiment can be used as a support or can be installed by being stuck to between layers or on the surface of an electronic component or circuit. Furthermore, by curing by applying energy by heating or light in these states, it is possible to obtain a structure with a buffer layer or a protective layer that exhibits sufficient heat resistance, is superior in shape recoverability and stretchability, and is low in stress relaxation. Alternatively, an object to be supported may be bonded to the film of the present embodiment, followed by curing by heat-molding or applying light such as ultraviolet rays.

The molded body, which is a cured product of the resin composition of the present embodiment or the like, can be used for electronics applications or as a material for various electronic components in various applications. In particular, it is preferable to apply the molded body to a substrate on which a circuit that serves as electricity or an electric signal is formed. In addition, since the resin composition of the present embodiment is low in stress relaxation, superior in recoverability, and also superior in both stretchability and heat resistance, it is very preferable as a material to be used for, for example, foldable electronic paper, organic EL displays, photovoltaic cells, RFID, and pressure sensors.

Moreover, it is also possible to form wiring on a support by using the resin composition of the present embodiment. The method of forming wiring is not particularly limited, and a known method such as ink jet printing, screen printing, stencil printing, intaglio printing, letterpress printing or planographic printing can be used.

Moreover, the resin composition of the present embodiment as described above is preferably formed as a thermosetting resin film on a support, and by using such a film, it is expected to be possible to realize a flexible display device or the like that can follow a free-form surface or can be greatly deformed. The method for forming the film is not particularly limited; for example, a generally usable coating machine such as a spin coater, a bar coater, or a comma coater can be used.

The support to be used for the film of the present embodiment is not particularly limited; for example, a hard support such as glass, metal, or a printed wiring board may be used, or alternatively, a resin film, a flexible substrate, or a support with flexibility and stretchability such as an elastomer may be used.

In the thermosetting resin film of the present embodiment, the case where the thickness is 1 μm to 1000 μm and the elastic modulus at 30° C. is 1 kPa to 1 GPa is preferable because the film is superior in transferability at the time of its sticking, so that it becomes easy to form a resin layer. Furthermore, when the elastic modulus at 30° C. is 10 kPa to 500 MPa, the adhesiveness is superior, so that it becomes easier to form a resin layer due to pressurization or heating and the transferability by sticking, and the film can be preferably used for transferring the film between layers or on a layer in the preparation of a structure. Furthermore, when the film is in the semi-cured state described above, there is an advantage that it becomes possible to achieve firm adhesion to an adherend by applying light, heating or heat-molding after bonding and it is possible to produce a structure superior in heat resistance and chemical resistance and superior in stress relaxation property.

An object in which wiring or a film is formed on a support as described above can be used as it is together with the support, or alternatively may be used independently by peeling from the support. Specifically, examples of use together with the support include a flexible substrate, a shield plate, etc. in which wiring is formed on a film and examples of use after peeling from the support include use as a heat dissipation film and wiring by offset printing.

As described above, the present description discloses various modes of technique, of which the main techniques are summarized below.

The thermosetting resin composition according to one aspect of the present invention includes an epoxy resin, an isocyanate resin, a polyrotaxane resin, and a curing agent, wherein the isocyanate resin includes a hexamethylene skeleton and at least one selected from a biuret skeleton, an isocyanurate skeleton, an allophanate skeleton, a neopentyl skeleton, a butylene skeleton, and a dicarboxyl skeleton in a structure thereof.

Due to such configurations, it is possible to provide a thermosetting resin composition being low in stress relaxation ratio and being superior in recoverability, heat resistance and stretchability.

In the thermosetting resin composition, the epoxy resin preferably includes a benzene ring skeleton, has a molecular weight of 200 g/mol to 6000 g/mol, and has an epoxy equivalent of 200 eq/g to 3000 eq/g. This offers an advantage that superior applicability is achieved because it dissolves with various materials and solvents during compounding and both maintenance of stretchability without becoming brittle and heat resistance can be attained.

Furthermore, in the thermosetting resin composition, the polyrotaxane resin preferably has a reactive hydroxyl group in its structure. This makes it possible to control the curability by heat curing and impart heat resistance. In addition, there is an advantage that a tough polymer network is formed and breaking strength is improved.

In the thermosetting resin composition, content of the epoxy resin is preferably 20 to 50% by mass based on an entire resin composition. Thereby, the effect described above can be acquired more reliably.

The thermosetting resin composition of the present embodiment is preferably used for electronics applications. Thereby, it can further exert the effects as described above.

Moreover, it is preferable that the thermosetting resin composition of the present embodiment be applied to a substrate on which a circuit being to serve as electricity or an electric signal is formed. Thereby, it can further exert the effects as described above.

The thermosetting resin film according to a further aspect of the present invention is characterized by being formed of the thermosetting resin composition described above.

The present invention will be described more specifically with reference to the following examples, but the scope of the present invention is not limited to the examples.

EXAMPLES

First, the materials used in the examples are as follows.
(Epoxy Resin)
Epoxy resin ("1003" manufactured by Mitsubishi Chemical Corporation, molecular weight: 1300, epoxy equivalent: 730 g/eq)
Epoxy resin ("1004" manufactured by Mitsubishi Chemical Corporation, molecular weight: 1650, epoxy equivalent: 930 g/eq)
Epoxy resin ("1009" manufactured by Mitsubishi Chemical Corporation, molecular weight: 3800, epoxy equivalent: 2700 g/eq)

Epoxy resin ("VG-3101" manufactured by Printec Corporation, molecular weight: 550, epoxy equivalent: 210 g/eq)

Epoxy resin ("EHPE3150" manufactured by ADEKA Corporation, molecular weight: 2000, epoxy equivalent: 180 g/eq)

Epoxy resin ("YX8000" manufactured by Mitsubishi Chemical Corporation, molecular weight: 1650, epoxy equivalent: 205 g/eq)

Epoxy resin ("YX4000" manufactured by Mitsubishi Chemical Corporation, molecular weight: 3800, epoxy equivalent: 190 g/eq)

Epoxy resin ("EP-4088S" manufactured by ADEKA Corporation, molecular weight: 350, epoxy equivalent: 170 g/eq)

(Isocyanate Resin)

Isocyanate resin ("D 172N" manufactured by Mitsui Chemicals, Inc., hexamethylene diisocyanate-modified isocyanurate-type isocyanate)

Isocyanate resin ("D165N" manufactured by Mitsui Chemicals, Inc., hexamethylene diisocyanate-modified biuret type isocyanate)

Isocyanate resin ("A201H" manufactured by Asahi Kasei Corp., hexamethylene diisocyanate-modified allophanate-type isocyanate)

Isocyanate resin ("D103H" manufactured by Mitsui Chemicals, Inc., tolylene diisocyanate-modified adduct-type isocyanate)

Isocyanate resin ("D204" manufactured by Mitsui Chemicals, Inc., tolylene diisocyanate-modified isocyanurate-type isocyanate)

Isocyanate resin ("DN955" manufactured by DIC Corporation, hexamethylene diisocyanate-modified neopentyl skeleton-containing isocyanate)

Isocyanate resin ("DN950" manufactured by DIC Corporation, hexamethylene diisocyanate-modified adduct-type isocyanate)

(Polyrotaxane)

Polyrotaxane: ("SH3400P" manufactured by Advanced Softmaterials Inc., having PEG as an axial molecule, α-cyclodextrin as a cyclic molecule, and an OH group as a reactive group; hydroxyl group equivalent: 780 eq/g, molecular weight: 700,000 g/mol)

(Curing Agent)

Imidazole-based curing accelerator ("2E4MZ" manufactured by Shikoku Chemicals Corporation, 2-ethyl-4-methylimidazole)

(Other Added Components)

Surfactant: Fluorine group-containing oligomer ("F-556" manufactured by DIC Corporation)

Examples 1 to 12 and Comparative Examples 1 to 6

The resin compositions of Examples 1 to 12 and Comparative Examples 1 to 6 were each prepared by adding the ingredients in the compounding formulation (parts by mass) shown in Table 1 to a solvent (methyl ethyl ketone) to achieve a solid concentration of 40% by mass and mixing them uniformly (300 rpm, 30 minutes).

Next, the resulting resin compositions were each applied to a 75 μm thick PET film (support) with a bar coater, dried at 100° C. for 10 minutes to remove the solvent, and then heat-cured at 170° C. for 60 minutes.

Each of the resulting cured products was processed to form a film having a dumbbell No. 6 form (measurement site width: 4 mm, parallel part length: 25 mm) having a thickness of 50 μm, which was used as a sample in the following evaluations.

[Stress Relaxation Property Test/Elastic Modulus Test]

In the stress relaxation property test and the elastic modulus test in the present examples, an extension process was carried out using a sample obtained above (a cured product piece of a resin composition, thickness: 50 μm, sample shape: dumbbell No. 6 (measurement site width: 4 mm, parallel part length: 25 mm)) under the conditions described below with an tensile tester compliant with ISO3384 (Autograph (model: AGS-X) manufactured by Shimadzu Corporation), and a stress relaxation ratio R and an elastic modulus were calculated by the calculation method described below.

(Extension Process Conditions)

Deflection correction is performed to remove the deflection that occurs when a specimen is attached to a gripper. The deflection correction was performed with a force of 0.05 N or less.

Test speed: 25 mm/min, to 0 to 25% extension

Temperature condition: 23° C.

Extension/retention conditions: at 25% extension, for a retention time of 5 minutes Stress relaxation ratio calculation method: A tensile force at the end of the extension process was measured, and this was defined as the initial tensile force FA0. Thereafter, the strain amount was maintained under the above-described extension/retention conditions, and after 5 minutes, the tensile force was measured. This is represented by FA(t5). A stress relaxation ratio R was calculated by the following formula.

$$R = \frac{F_{AO} - F_A(t5)}{F_{AO}} \times 100 \qquad \text{[Formula 1]}$$

Elastic modulus calculation method: An elastic modulus (MPa) was calculated by dividing the amount of stress displacement between two points, namely, a strain of 1% and a strain of 5% in the extension process by the amount of strain displacement.

[Recoverability Test]

Determination "○ (passed)" was made when no deflection occurred when returning to the origin at the same speed after the stress relaxation property test and the elastic modulus test described above, whereas determination "x (failed)" was made when deflection occurred.

[Solder Test]

A 5 cm square film was floated on a solder bath set at 260° C. and was left for 1 minute. The appearance after the test was checked, and determination "○ (passed)" was made when there was no particular change, and determination "x (failed)" was made when there was a change such as melting, deformation, or discoloration.

[Tensile Elongation Test (Elongation Property)]

Similar to the stress relaxation property test and the elastic modulus test, an extension process was performed under the following conditions, and the elongation ratio was measured by the following calculation method.

(Extension Process Conditions)

Deflection correction is performed to remove the deflection that occurs when a sample piece is attached to a gripper. The deflection correction was performed with a force of 0.05 N or less.

Test speed: 25 mm/min, 0% to break of specimen

Temperature condition: 23° C.

Elongation calculation method: An elongation ratio (%) in percentage was calculated by dividing the amount of strain at break of the specimen by 25 mm, which is the distance between the fulcrums of the sample.

[Applicability to PET]

When applying each of the resin compositions of Examples and Comparative Examples to PET, determination "○ (pass)" was made when the application was performed without any problems, determination "Δ (allowable)" was made when cissing occurred in some regions, and determination "x (failed)" was made when a film could not be formed.

The results of the above evaluation tests are summarized in Table 1. In Table 1, "-" indicates that measurement could not be performed because of breakage that occurred during the test.

TABLE 1

| | | Example 1 | Example 2 | Example 3 | Example 4 | Example 5 | Example 6 | Example 7 | Example 8 | Example 9 |
|---|---|---|---|---|---|---|---|---|---|---|
| Epoxy | 1003 | 40.0 | 40.0 | 36.0 | 41.8 | | | | | |
| | 1004 | | | | | 41.8 | | | | |
| | 1009 | | | | | | 41.8 | | | |
| | VG3101 | | | | | | | 39.8 | | |
| | EHPE3150 | | | | | | | | 41.8 | |
| | YX8000 | | | | | | | | | 41.8 |
| | YX4000 | | | | | | | | | |
| | EP-408BS | | | | | | | | | |
| Polyrotaxane | SH2400P | 45.1 | 48.4 | 37.0 | 43.8 | 43.8 | 43.8 | 43.8 | 43.8 | 43.8 |
| Polyisocyanate | D172N | 14.4 | | | | | | | | |
| | D165N | | 11.1 | | | | | | | |
| | DN955 | | | 26.0 | | | | | | |
| | A201H | | | | 13.6 | 13.6 | 13.6 | 13.6 | 13.6 | 13.6 |
| | D103H | | | | | | | | | |
| | DN950 | | | | | | | | | |
| | D204 | | | | | | | | | |
| Curing accelerator | 2E4MZ | 0.2 | 0.2 | 0.2 | 0.2 | 0.2 | 0.2 | 0.2 | 0.2 | 0.2 |
| Surfactant | F556 | 0.5 | 0.5 | 0.5 | 0.5 | 0.5 | 0.5 | | 0.5 | 0.5 |
| Evaluation test | Stress relaxation | 23.0% | 22.0% | 8.2% | 10.5% | 12.0% | 20.0% | 15.0% | 9.0% | 7.0% |
| | Elastic modulus | 3.1 MPa | 3.8 MPa | 1.6 MPA | 1.3 MPa | 3 MPa | 4 MPa | 3.5 MPa | 1.5 MPs | 1.8 MPa |
| | Recoverability | ○ | ○ | ○ | ○ | ○ | ○ | ○ | ○ | ○ |
| | Solder test | ○ | ○ | ○ | ○ | ○ | ○ | ○ | ○ | ○ |
| | Elongation | 190% | 150% | 342% | 300% | 268% | 276% | 145% | 200% | 124% |
| | Applicability to PET | ○ | ○ | ○ | ○ | ○ | ○ | Δ | ○ | ○ |

| | | Example 10 | Example 11 | Example 12 | Comparative Example 1 | Comparative example 2 | Comparative example 3 | Comparative Example 4 | Comparative Example 5 | Comparative Example 6 |
|---|---|---|---|---|---|---|---|---|---|---|
| Epoxy | 1003 | | | 13.0 | | 40.0 | 40.0 | 40.0 | 39.7 | 41.3 |
| | 1004 | | | | | | | | | |
| | 1009 | | | | | | | | | |
| | VG3101 | | | | | | | | | |
| | EHPE3150 | | | | | | | | | |
| | YX8000 | | | | | | | | | |
| | YX4000 | 41.8 | | | | | | | | |
| | EP-408BS | | 41.8 | | | | | | | |
| Polyrotaxane | SH2400P | 43.8 | 43.8 | 65.0 | 45.1 | | 45.1 | 45.2 | 41.6 | 41 |
| Polyisocyanate | D172N | | | | 14.4 | 14.4 | | | | |
| | D165N | | | | | | | | | |
| | DN955 | | | | | | | | | |
| | A201H | 13.6 | 13.6 | 13.6 | | | | | | |
| | D103H | | | | | | | 14.3 | | |
| | DN950 | | | | | | | | 18.0 | |
| | D204 | | | | | | | | | 17 |
| Curing accelerator | 2E4MZ | 0.2 | 0.2 | 0.2 | 0.2 | 0.2 | 0.2 | 0.2 | 0.2 | 0.2 |
| Surfactant | E556 | 0.5 | 0.5 | 0.5 | 0.5 | 0.5 | 0.5 | | 0.5 | 0.5 |
| Evaluation test | Stress relaxation | 9.5% | 5.0% | 3.0% | 9.0% | — | 63.0% | 76.0% | 55.0% | 65.0% |
| | Elastic modulus | 2.2 MPa | 1.0 MPa | 1.5 MPa | 9 MPa | — | 0.5 MPa | 101.4 MPa | 20 MPa | 83 MMPa |
| | Recoverability | ○ | ○ | ○ | — | — | x | x | x | x |
| | Solder test | ○ | ○ | ○ | ○ | — | x | x | x | ○ |
| | Elongation | 105% | 100% | 150% | 15% | — | 425% | 223% | 165% | 150% |
| | Applicability to PET | ○ | ○ | Δ | ○ | x | ○ | Δ | ○ | ○ |

(Results and Discussion)

From the above results, it is shown that the resin composition according to the present invention is a thermosetting resin composition being low in small stress relaxation ratio and being superior in shape recoverability, heat resistance and stretchability. It is considered that the combination of the characteristics of being low in stress relaxation property during tension and being superior in recoverability and the characteristics of being superior in heat resistance made the resin composition to be soft and to be possible to recover its original shape immediately even when being deformed and have the performance of being able to withstand even in a temperature range where solder melts. In addition, by using the resin composition of the present invention, it is possible to produce an electronic circuit that is adaptable in conventional processes and that immediately follows various movements such as clothes or the skin worn by a person without requiring a special device. Furthermore, since the elastic modulus is in an appropriate range (about 1 to 10 MPa), it can be seen that the resin composition has a balance between handleability and softness.

On the other hand, Comparative Example 1, in which no epoxy resin was included, resulted in poor recoverability and poor elongation property. Further, in Comparative Example 2, in which no polyrotaxane resin was included, no film was formed due to the occurrence of repelling after the application to PET, so that no film piece was formed successfully. On the other hand, in Comparative Example 3, in which no polyisocyanate resin was included, the stress relaxation was high, the elastic modulus was very low, and the recoverability and heat resistance were poor.

In Comparative Examples 4 to 6 using the isocyanate resins of types that are not the isocyanate resin of the present invention, the stress relaxation and the elastic modulus were very high, resulting in poor recoverability and heat resistance.

This application is based on Japanese Patent Application No. 2017-132064 filed on Jul. 5, 2017, the contents of which are included in this application.

In order to express the present invention, the present invention has been appropriately and fully described by way of embodiments with reference to specific examples and the like in the above; however, it is to be recognized that those skilled in the art can readily make changes and/or modifications on the above-described embodiments. Therefore, it is to be interpreted that the changed modes or modified modes carried out by those skilled in the art are encompassed within the scope of the rights of the claims unless those changed modes or modified modes are at a level that departs from the scope of the rights of the claims set forth in the claims.

INDUSTRIAL APPLICABILITY

The present invention has wide industrial applicability in the technical field related to electronic materials and various devices using the same.

The invention claimed is:

1. A thermosetting resin composition comprising
an epoxy resin,
an isocyanate resin,
a polyrotaxane resin, and
a curing agent other than the isocyanate resin,
wherein the isocyanate resin includes at least one selected from the group consisting of hexamethylene diisocyanate-modified isocyanurate isocyanate, hexamethylene diisocyanate-modified biuret isocyanate, and hexamethylene diisocyanate-modified allophanate isocyanate.

2. The thermosetting resin composition according to claim 1,
wherein the epoxy resin
includes a benzene ring skeleton,
has a molecular weight of 200 g/mol to 6000 g/mol, and
has an epoxy equivalent of 200 eq/g to 3000 eq/g.

3. The thermosetting resin composition according to claim 1, wherein the polyrotaxane resin has a reactive hydroxyl group in the structure thereof.

4. The thermosetting resin composition according to claim 1, wherein content of the epoxy resin is 20 to 50% by mass based on the entire resin composition.

5. The thermosetting resin composition according to claim 1, which is used for electronics applications.

6. The thermosetting resin composition according to claim 5, which is applied to a substrate on which a circuit serving as an electric or electric signal is formed.

7. A thermosetting resin film formed of the thermosetting resin composition according to claim 1.

* * * * *